(12) United States Patent
Yoon et al.

(10) Patent No.: US 12,477,801 B2
(45) Date of Patent: Nov. 18, 2025

(54) METHOD OF MANUFACTURING A SEMICONDUCTOR DEVICE INCLUDING A CONDUCTIVE LINE

(71) Applicant: SK hynix Inc., Icheon-si (KR)

(72) Inventors: Jae Man Yoon, Icheon-si (KR); Jun Ki Kim, Icheon-si (KR); Tae Kyun Kim, Icheon-si (KR); Jung Woo Park, Icheon-si (KR); Jae Won Ha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 423 days.

(21) Appl. No.: 18/095,349

(22) Filed: Jan. 10, 2023

(65) Prior Publication Data

US 2024/0079456 A1  Mar. 7, 2024

(30) Foreign Application Priority Data

Sep. 2, 2022  (KR) .................. 10-2022-0111259

(51) Int. Cl.
*H10D 64/01* (2025.01)
*H01L 21/02* (2006.01)
(Continued)

(52) U.S. Cl.
CPC ....... *H10D 64/01* (2025.01); *H01L 21/02266* (2013.01); *H01L 21/0337* (2013.01); *H01L 21/28061* (2013.01); *H01L 21/28518* (2013.01); *H01L 21/28525* (2013.01); *H01L 21/32053* (2013.01); *H01L 21/32055* (2013.01); *H01L 21/32134* (2013.01); *H01L 21/32135* (2013.01);
(Continued)

(58) Field of Classification Search
CPC  H01L 21/32139; H01L 21/768–76898; H10D 64/01
See application file for complete search history.

(56) References Cited

U.S. PATENT DOCUMENTS 5,739,047 A * 4/1998  Chiang ............. H01L 21/76844
                                                        438/653
8,389,355 B2   3/2013  Won et al.
(Continued)

FOREIGN PATENT DOCUMENTS

KR        101983219 B1     5/2019

*Primary Examiner* — Erik Kielin
(74) *Attorney, Agent, or Firm* — WILLIAM PARK AND ASSOCIATES LTD.

(57) ABSTRACT

A method of manufacturing a semiconductor device includes: forming a trench in an insulating interlayer by etching the insulating interlayer; forming a conductive layer on bottom, side, and upper surfaces of the insulating interlayer where the trench is formed, using a first deposition process, the conductive layer on the bottom surface of the trench being thicker than the conductive layer on the side surface of the trench; forming a sacrificial layer in the trench covering the conductive layer formed on the bottom surface of the trench using a second deposition process different from the first deposition process; selectively removing the conductive layer formed on the upper surface of the insulating interlayer and formed on the side surface of the trench left exposed through the sacrificial layer; and selectively removing the sacrificial layer, to form a conductive line using the conductive layer remaining on the bottom surface of the trench.

17 Claims, 13 Drawing Sheets

(51) Int. Cl.
*H01L 21/033* (2006.01)
*H01L 21/28* (2025.01)
*H01L 21/285* (2006.01)
*H01L 21/3205* (2006.01)
*H01L 21/3213* (2006.01)
*H01L 21/768* (2006.01)

(52) U.S. Cl.
CPC .. *H01L 21/32139* (2013.01); *H01L 21/76807* (2013.01); *H01L 21/76837* (2013.01); *H01L 21/76877* (2013.01)

(56) References Cited

U.S. PATENT DOCUMENTS

| | | | |
|---|---|---|---|
| 11,374,011 B1* | 6/2022 | Kuroda | H10B 12/03 |
| 2005/0191820 A1* | 9/2005 | Tu | H10D 1/716 |
| | | | 438/398 |
| 2008/0121961 A1* | 5/2008 | Schloesser | H10B 12/488 |
| | | | 365/182 |
| 2023/0360969 A1* | 11/2023 | Chung | H01L 21/76843 |

\* cited by examiner

METHOD OF MANUFACTURING A SEMICONDUCTOR DEVICE INCLUDING A CONDUCTIVE LINE

CROSS-REFERENCES TO RELATED APPLICATION

The present application claims priority under 35 U.S.C. § 119(a) to Korean application number 10-2022-0111259, filed on Sep. 2, 2022, in the Korean Intellectual Property Office, which is incorporated herein by reference in its entirety.

BACKGROUND

1. Technical Field

Various embodiments generally relate to a method of manufacturing a semiconductor device, and more particularly, to a method of manufacturing a semiconductor device including a conductive line.

2. Related Art

As a width of a semiconductor device may have been fined and an integration degree of the semiconductor device may have been increased, a conductive line may be formed using a Damascene technology.

In the Damascene technology, a linear trench may be formed in an insulation layer. The trench may be filled with a conductive layer to form a conductive line. Recently, as the semiconductor device may have been highly integrated, the width of the semiconductor device may have been greatly reduced so that technologies for filling the trench with a conductive layer without an electrical defect may have been proposed.

SUMMARY

In accordance with the present disclosure is a method of manufacturing a semiconductor device. The method includes: providing an insulating interlayer; forming a trench in the insulating interlayer by etching a selected portion of the insulating interlayer; forming a conductive layer on a bottom, a side, and an upper surface of the insulating interlayer where the trench is formed, using a first deposition process, wherein a thickness of the conductive layer formed on the bottom surface of the trench is greater than a thickness of the conductive layer formed on the side surface of the trench; forming a sacrificial layer in the trench to cover the conductive layer formed on the bottom surface of the trench using a second deposition process different from the first deposition process; selectively removing the conductive layer formed on the upper surface of the insulating interlayer and formed on the side surface of the trench left exposed through the sacrificial layer; and selectively removing the sacrificial layer, to form a conductive line using the conductive layer remaining on the bottom surface of the trench.

In accordance with the present disclosure is a method of manufacturing a semiconductor device. The method includes: providing an insulation layer including a first hole, the first hole having a first aspect ratio; forming a conductive layer on the insulation layer by a first deposition process, the first deposition process having a first deposition rate on a side surface of the first hole and a second deposition rate on a bottom surface of the first hole, and the second deposition rate being higher than the first deposition rate; forming a sacrificial layer in the first hole to cover the conductive layer on the bottom surface of the first hole; selectively removing the conductive layer formed on the side surface of the first hole exposed through the sacrificial layer; removing the sacrificial layer to define a second hole on the conductive layer in the first hole, the second hole having a second aspect ratio lower than the first aspect ratio; and forming a gap-filling insulation layer in the second hole.

In accordance with the present disclosure is a method of manufacturing a semiconductor device. The method includes: providing a semiconductor substrate including an impurity region; etching the semiconductor substrate to form a trench; forming a gate insulation layer on a surface of the trench and an upper surface of the semiconductor substrate; forming a first gate conductive layer on the gate insulation layer by a first deposition process, the first deposition process having a first deposition rate on a portion substantially parallel to the upper surface of the semiconductor substrate and a second deposition rate on a portion substantially perpendicular to the upper surface of the semiconductor substrate, wherein the second deposition rate is higher than the first deposition rate; forming a sacrificial layer in the trench to expose the first gate conductive layer on the upper surface of the semiconductor substrate and a side surface of the trench; selectively removing the first conductive layer exposed through the sacrificial layer; and removing the sacrificial layer to form a buried gate using the first gate conductive layer remaining in the trench.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

FIGS. 1A to 1H are cross-sectional views illustrating a method of forming a conductive line of a semiconductor device in accordance with example embodiments.

Figure 1A:
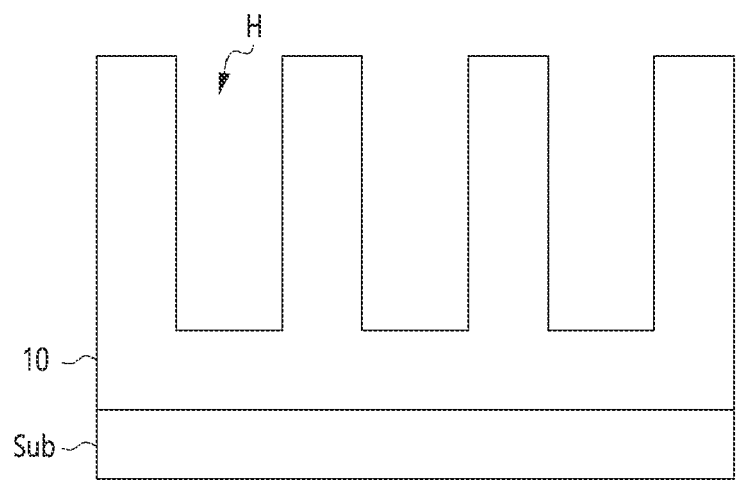
FIGS. 1A to 1H are cross-sectional views illustrating a method of forming a conductive line of a semiconductor device in accordance with example embodiments.

Referring to FIG. 1A, an insulation layer 10 may be formed on an upper surface of a substrate Sub. For example, the insulation layer 10 may include at least one of an insulation layer having a low dielectric constant, a silicon oxide layer, and a silicon nitride layer, but is not limited thereto.

Various circuit layers and various insulation layers may be interposed between the substrate Sub and the insulation layer 10. The insulation layer 10 may be etched to form a contact hole H. The contact hole H may include a though hole, a trench, a groove, etc. The contact hole H may have a linear shape or a pattern shape from a planar view.

Figure 1B:
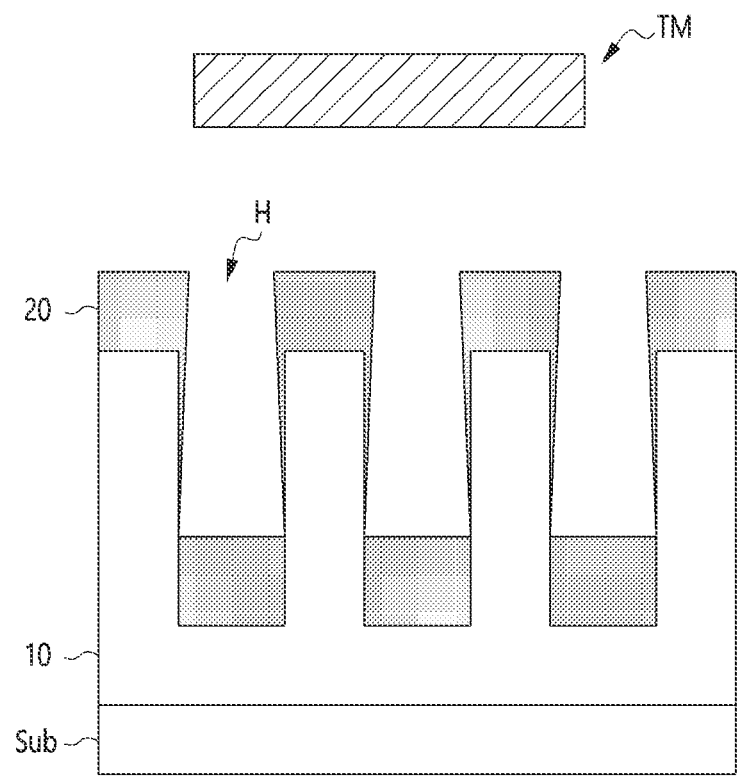

Referring to FIG. 1B, a first conductive layer 20 may be formed in the contact hole H by a first deposition process. The first deposition process may have a poor step coverage property. For example, in the first deposition process, a deposition may be more performed on a surface facing a target material TM, for example, a conductive material. Thus, a first portion of the first conductive layer 20 on a side surface of the contact hole H may have a thickness thinner than a thickness of a second portion of the first conductive layer 20 on an upper surface of the insulation layer 10 and a bottom surface of the contact hole H facing the target material TM. That is, the thickness of the second portion in the first conductive layer 20 on the upper surface of the insulation layer 10 and the bottom surface of the contact hole H may be thicker than the thickness of the first portion in the first conductive layer 20 on the side surface of the contact hole H. The bottom surface of the contact hole H may be substantially parallel to the upper surface of the substrate Sub.

The first deposition process may include a physical vapor deposition (PVD) process, such as a sputtering process and thermal evaporation. Because the first deposition process may have a good deposition characteristic with respect to one direction, the first deposition process may have a relatively low step coverage characteristic when a layer may be deposited on an uneven surface.

Figure 2:
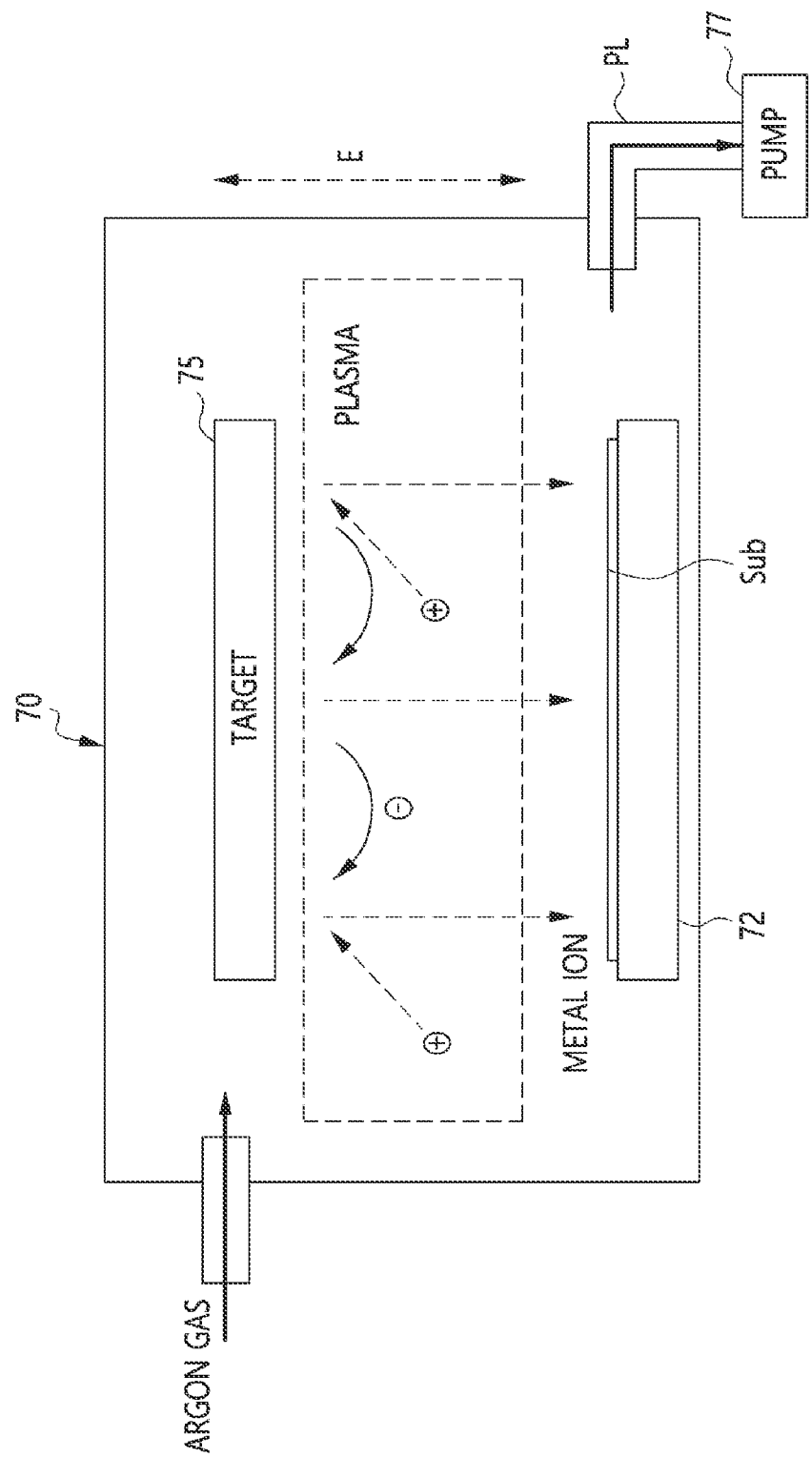
FIG. 2 is a view illustrating a principle of a PVD process in accordance with example embodiments.

FIG. 2 is a view illustrating a principle of a PVD process in accordance with example embodiments.

Referring to FIG. 2, the first deposition process may be performed in a PVD chamber 70, for example a sputter chamber.

The PVD chamber 70 may include a supporting member 72 configured to support the substrate Sub and a target 75 facing the supporting member 72. The target 75 may correspond to a reference symbol TM in FIG. 1B. The target 75 may be a main material of the first conductive layer 20.

The PVD chamber 70 may further include a vacuum pump 77 and pumping line PL. The PVD chamber may include an inner space under a high vacuum state by the vacuum pump 77 and the pumping line PL.

To generate ions for attaching the target 75, an argon gas as a reaction gas may be introduced into the PVD chamber 70 under the vacuum state. When an RF power or a DC voltage of about 5,000V may be applied to the PVD chamber 70, an electric field E may be generated between the target 75 and the substrate Sub so that the argon gas may be converted into plasma state with an electrons and cation.

The argon gas may be an inert gas having a neutral state. However, an outermost electron of an argon atom may be released by the plasma. The released electron may collide against the target 75 to break a chemical bond of the target 75. Thus, metal ions of the target 75 may be straightly moved toward the substrate Sub to deposit the target on the substrate Sub.

The PVD process may use the straightness of the metal ions released from the target 75. Thus, a deposition rate may be changed in accordance with a direction of the metal ions. The layer formed by the PVD process might not include impurities. When the first conductive layer 20 may be formed by the PVD process, the deposition rate of the first conductive layer 20 on the bottom surface of the contact hole H and the upper surface of the insulation layer 10 facing (parallel to) the target 75 may be relatively higher than the deposition rate of the first conductive layer 20 on the side surface (sidewall) of the contact hole H substantially perpendicular to the target 75. Thus, the second portion of the first conductive layer 20 on the bottom surface of the contact hole H and the upper surface of the insulation layer 10 may have a set thickness. In contrast, the first portion of the first conductive layer 20 on the side surface of the contact hole H may have a thickness of below the set thickness. Alternatively, the first conductive layer 20 might not be formed on the side surface of the contact hole H.

In example embodiments, the first conductive layer 20 may include at least one of a metal layer having at least one metal element; a metal nitride layer having at least one metal element and nitrogen element; a metal oxynitride layer having at least one metal element, nitrogen element, and oxygen element; a metal silicide having at least one metal element and silicon element; and a doped polysilicon layer including conductive impurities. For example, the metal layer may include W, Al, Cu, Ti, Ta, Ru, Zr, Mo, Rh, TiW, TaW, etc. The metal nitride layer may include TiN, TaN, WN, MoN, NbN, TiSiN, TiAlN, TiBN, ZrSiN, WSiN, WBN, ZrAlN, MoSiN, MoAlN, TaSiN, TaAlN, etc. The metal oxynitride layer may include TiON, TiAlON, WON, TaON, etc. The metal silicide may include TiSi, TaSi, PtSi, MoSi, WSi, etc. However, the first conductive layer 20 may include various metal or conductive materials, not limited within the materials indicated above.

Figure 1C:
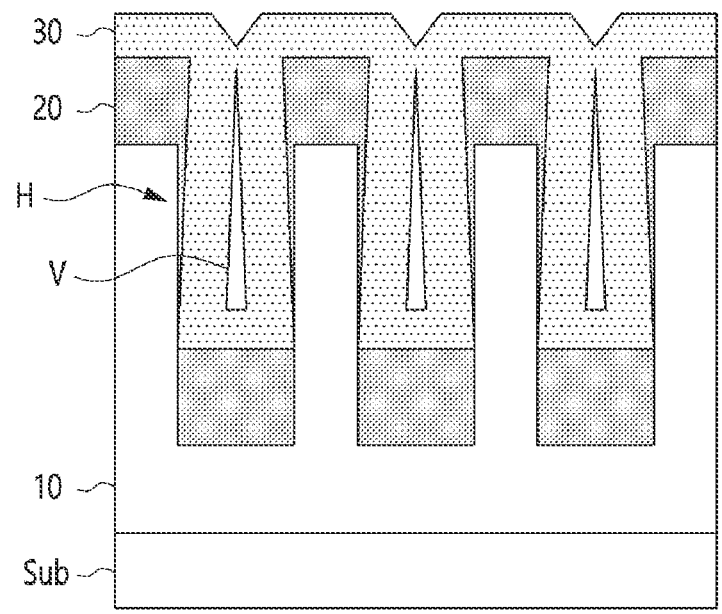

Referring to FIG. 1C, a sacrificial layer 30 may be formed on the first conductive layer 20.

In example embodiments, the sacrificial layer 30 may be formed by a second deposition process. The second deposition process may have step coverage better than that of the first deposition process. The sacrificial layer 30 may be formed by a chemical vapor deposition (CVD) process, a plasma enhanced chemical vapor deposition (PECVD) process, an atomic layer deposition (ALD) process, a plasma enhanced atomic layer deposition (PEALD) process, etc. Because the sacrificial layer 30 may be formed along the inner surface of the contact hole H with the first conductive layer 20, a void V or a seam may be generated in the sacrificial layer 30 although the sacrificial layer 30 may be formed by the second deposition process having the good step coverage.

The sacrificial layer 30 may function as to protect the first conductive layer 20 on the bottom surface of the contact hole H. For example, the sacrificial layer 30 may include a material having a good high etching selectivity with respect to the first conductive layer 20 and the insulation layer 10. The sacrificial layer 30 may include a silicon nitride layer.

Figure 1D:
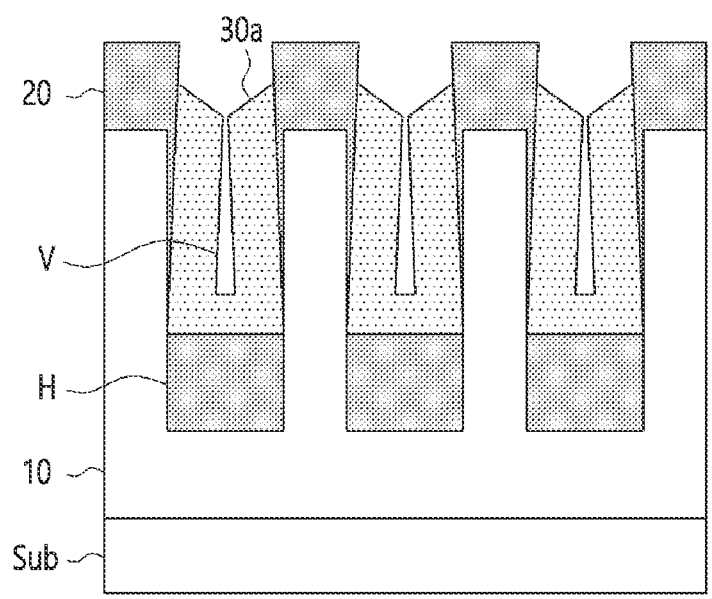

Referring to FIG. 1D, the sacrificial layer 30 may be selectively etched (or removed) to expose the first conductive layer 20.

In example embodiments, the sacrificial layer 30 may be anisotropically etched to expose the first conductive layer 20 on the insulation layer 10. The first conductive layer 20 on the bottom surface of the contact hole H may remain covered by the sacrificial layer 30.

Figure 1E:
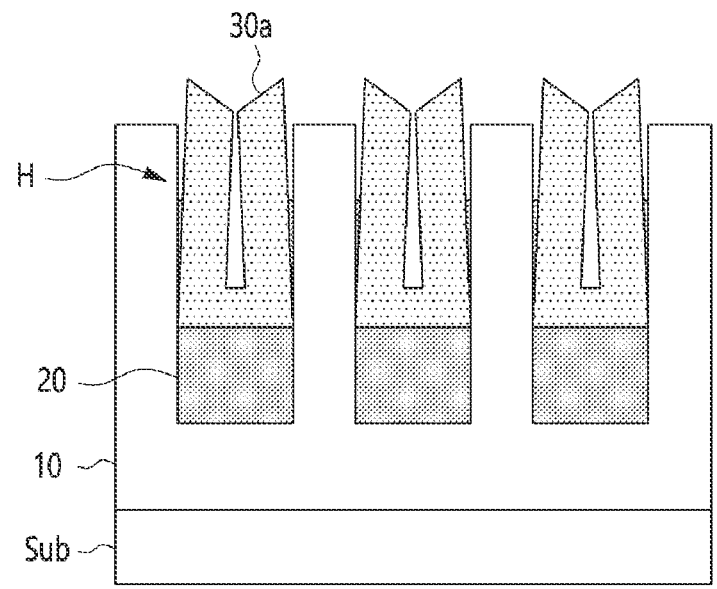

Referring to FIG. 1E, the exposed first conductive layer 20 may be selectively removed using the remaining sacrificial layer 30 as a mask. Because an etching selectively may exist between the first conductive layer 20 and the sacrificial layer 30, the first conductive layer 20 on the upper surface of the insulation layer 10 outside the contact hole H and the side surface of the contact hole H may be selectively removed.

In example embodiments, the first conductive layer 20 may be removed by at least one of a wet etching process and a dry etching process. Because the sacrificial layer 30 may cover the first conductive layer 20 on the bottom surface of the contact hole H, the first conductive layer 20 on the bottom surface of the contact hole H might not be removed.

Figure 1F:
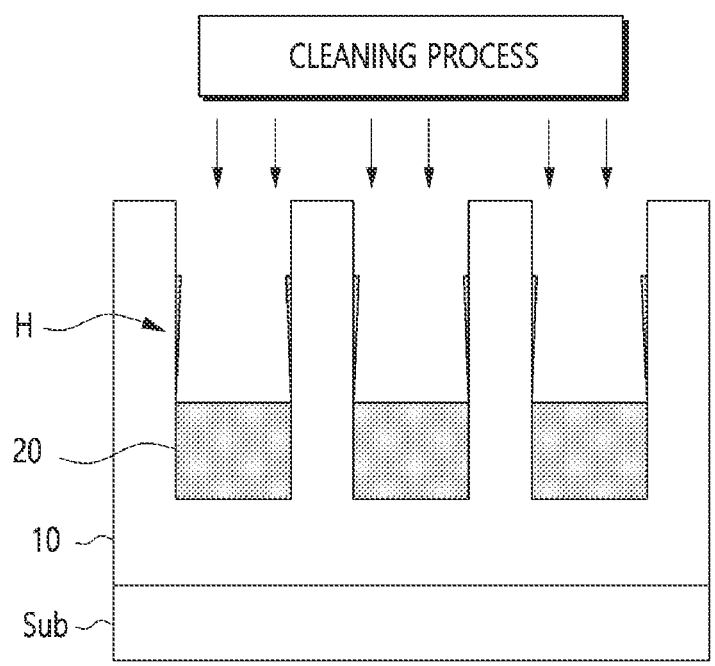

Referring to FIG. 1F, the sacrificial layer 30 in the contact hole H may be selectively removed.

The sacrificial layer 30 may be selectively removed using an etching agent having a good etching selectivity with respect to the insulation layer 10 and the first conductive layer 20. For example, the sacrificial layer 30 may be removed by a wet etching process, but is not limited thereto. For example, when the sacrificial layer 30 includes a silicon nitride layer, the sacrificial layer 30 may be removed using a $PH_3$ solution.

By the removal of the sacrificial layer 30, the first conductive layer 20 may remain on the bottom surface of the contact hole H. In contrast, the first conductive layer 20 might not remain on the side surface of the contact hole H. Alternatively, a tiny amount of the first conductive layer 20 may remain on the side surface of the contact hole H.

When the tiny amount of the first conductive layer 20 remains on the side surface of the contact hole H, the first conductive layer 20 on the side surface of the contact hole H may be removed by a cleaning process. Because the cleaning process may remove the tiny amount of the first conductive layer 20, the thickness of the first conductive layer 20 on the bottom surface of the contact hole H might not be affected by the cleaning process. The cleaning process may include a wet cleaning process or a dry cleaning process, but is not limited thereto.

Figure 1G:
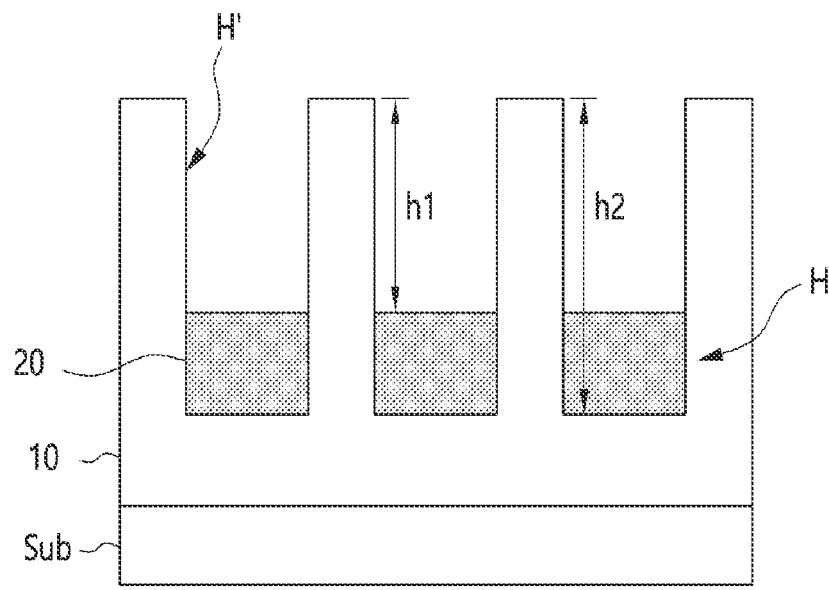

Referring to FIG. 1G, the first conductive layer 20 on the side surface of the contact hole H may be removed by the cleaning process. The first conductive layer 20 may remain on a bottom surface of a contact hole H' as a pattern shape. Thus, a height h1 of an empty space in the contact hole H' may be less than a height h2 of the initial contact hole H to form the contact hole H' having an improved aspect ratio by the first conductive layer 20.

Figure 1H:
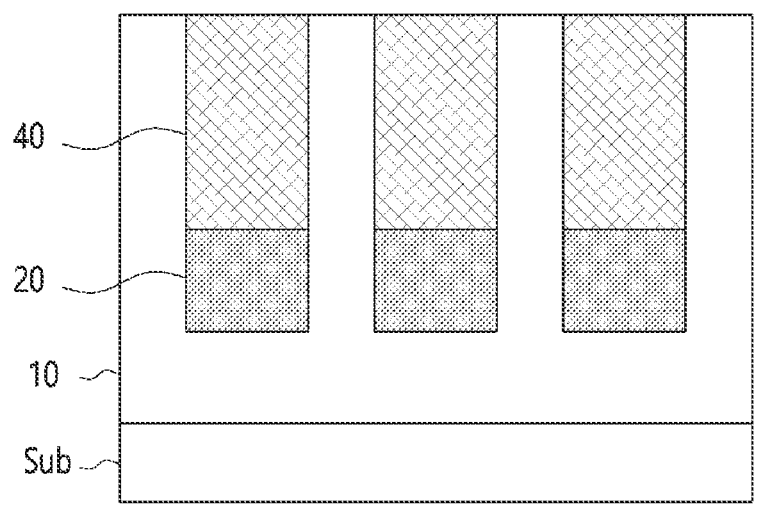

Referring to FIG. 1H, a buried layer 40 may be formed in the contact hole H' with the first conductive layer 20. The buried layer may include at least one of a conductive layer and an insulation layer. In example embodiments, the buried layer 40 may include a gap-filling insulation layer in the contact hole H'. The gap-filling insulation layer may include a spin on dielectric having a good burying characteristic. Alternatively, the buried layer 40 may include a second conductive layer on the first conductive layer 20 and a gap-filling insulation layer on the second conductive layer. The second conductive layer may include a material different from the material of the first conductive layer 20. For example, the second conductive layer may include a polysilicon layer doped with impurities.

In example embodiments, the buried layer 40 may be formed by a third deposition process different from the first deposition process. The third deposition process may have step coverage better than that of the first deposition process. The third deposition process may be substantially the same as the first deposition process. Alternatively, the step coverage of the third deposition process may be greater than the step coverage of the second deposition process.

For example, the third deposition process may include a CVD process, a PECVD process, an ALD process, a PEALD process or a spin coating process.

The buried layer 40 may be formed in the contact hole H' having the improved aspect ratio by the third deposition process. Thus, a void or a seam might not be generated in the contact hole H'. The buried layer 40 may then be removed by a chemical mechanical polishing (CMP) process.

FIGS. 3A to 3G are perspective views illustrating a method of forming a conductive line by a Damascene process in accordance with example embodiments. For example, the conductive line may be a bit line.

Figure 3A:
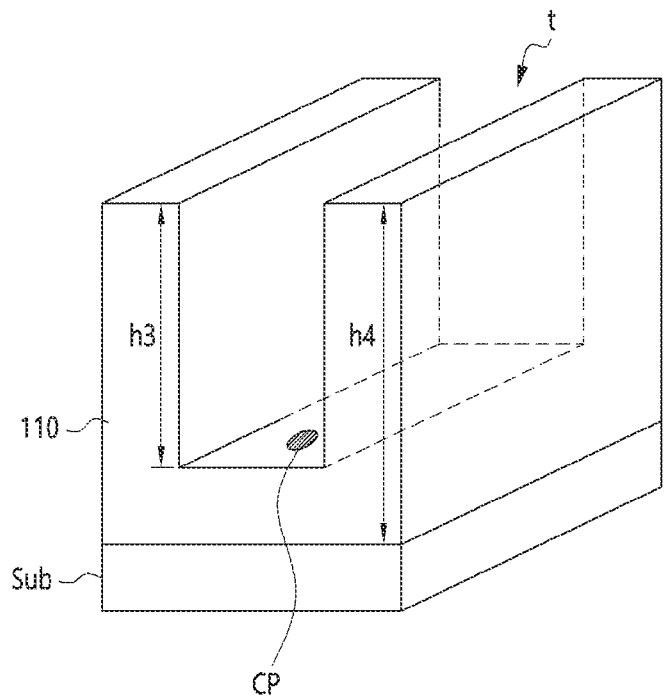
FIGS. 3A to 3G are perspective views illustrating a method of forming a conductive line by a Damascene process in accordance with example embodiments.

Referring to FIG. 3A, an insulating interlayer 110 may be formed on a substrate Sub. A peripheral circuit layer (not shown) may be arranged between the substrate Sub and the insulating interlayer 110. For example, the peripheral circuit layer may include a plurality of circuit patterns for driving memory cells. The insulating interlayer 110 may include a plurality of contact plugs CP having different functions electrically connected with the peripheral circuit layer and conductive terminals to be formed in or on the insulating interlayer 110.

For example, the insulating interlayer 110 may include a silicon oxide layer. Alternatively, the insulating interlayer 110 may include multi-layers having a planarization insulation layer.

The insulating interlayer 110 may be etched to form a trench t having a linear shape. The trench t may be formed at a region where a bit line of a semiconductor memory device is to be formed. A width of the trench t may be determined considering a line width of the bit line. Some of the contact plugs CP may be exposed through a bottom surface of the trench t. The trench t may have a height h3 less than a thickness h4 of the insulating interlayer 110.

Figure 3B:
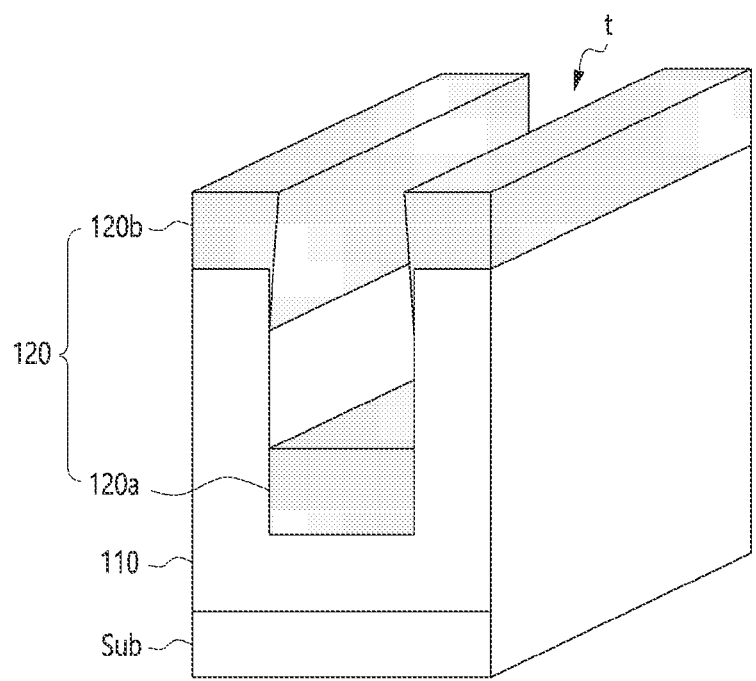

Referring to FIG. 3B, a conductive layer 120 for the bit line may be formed on the insulating interlayer 110 and within the trench t by a first deposition process, such as the PVD process. As indicated above, because the PVD process may have the high deposition rate of the portion facing the target material, the conductive layer 120 on the bottom surface of the trench t and the insulating interlayer 110 may have a relatively thick thickness. The thickness of the conductive layer 120 may be thicker by about 1% to about 20% than the thickness of the bit line. The thick thickness of the conductive layer 120 may be considered when the conductive layer 120 may be lost in a following cleaning process. In FIG. 3B, a reference numeral 120a may refer to a conductive layer for a first bit line on the bottom surface of the trench t. A reference numeral 120b may refer to a conductive layer for a second bit line on a side surface of the trench t and an upper surface of the insulating interlayer 110. For example, the conductive layer 120a for the first bit line may include a metal layer having at least one metal element, a metal nitride layer having at least one metal element and nitrogen element, a metal oxynitride layer having at least one metal element, nitrogen element and oxygen element, a metal silicide having at least one metal element and silicon element, a doped polysilicon layer, etc.

For example, the metal layer may include W, Al, Cu, Ti, Ta, Ru, Zr, Mo, Rh, TiW, TaW, etc. The metal nitride layer may include TiN, TaN, WN, MoN, NbN, TiSiN, TiAlN, TiBN, ZrSiN, WSiN, WBN, ZrAlN, MoSiN, MoAlN, TaSiN, TaAlN, etc. The metal oxynitride layer may include TiON, TiAlON, WON, TaON, etc. The metal silicide may include TiSi, TaSi, PtSi, MoSi, WSi, etc. However, the conductive layer 120*a* may include various metal or conductive materials, not limited within the materials indicated above.

Figure 3C:
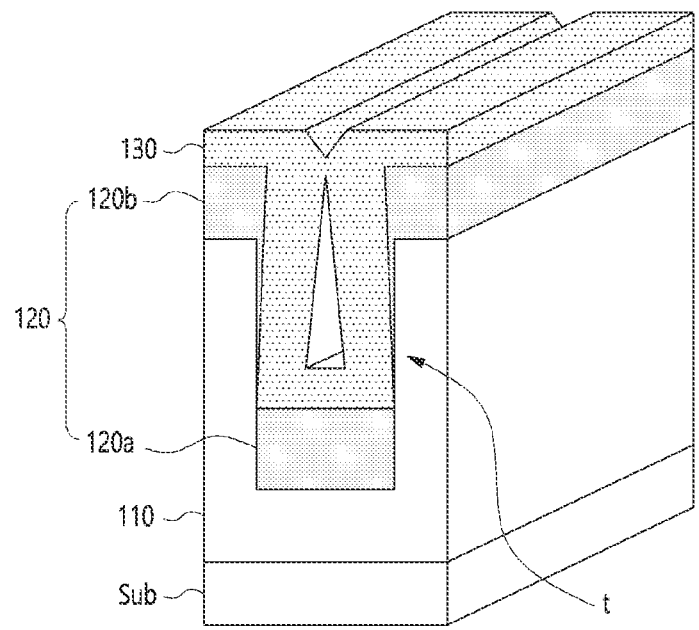

Referring to FIG. 3C, a sacrificial layer 130 may be formed in the trench t. For example, the sacrificial layer 130 may include a material having an etching selectivity different from an etching selectivity of the insulating interlayer 110 and the conductive layer 120. For example, the sacrificial layer 130 may include a silicon nitride layer. The sacrificial layer 130 may be formed by a CVD process having a step coverage better than that of the PVD process. A thickness of the sacrificial layer 130 may be set not to fill up the trench t. For example, the thickness of the sacrificial layer 130 may be less than a width of the trench t with the conductive layer 120. However, an overhang may be generated at an entrance of the trench t by the conductive layer 120 having an irregular thickness in depositing the sacrificial layer 130 to generate the void v in the trench t.

Figure 3D:
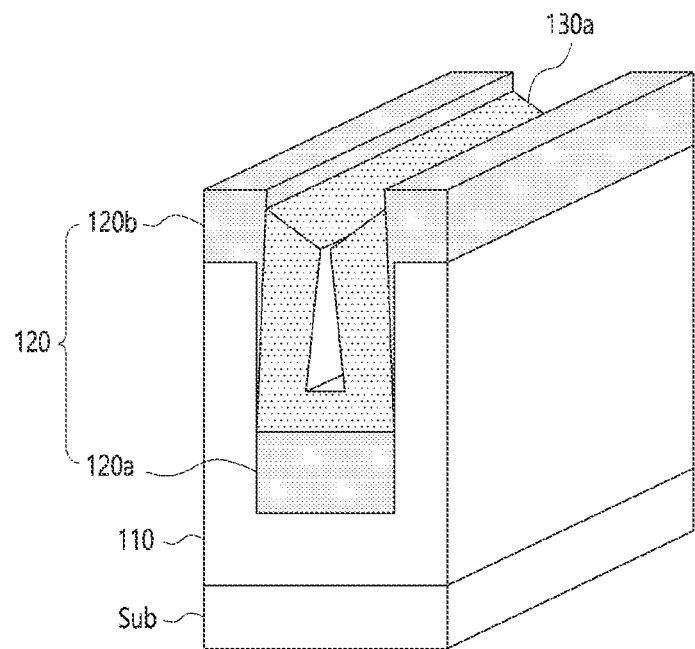

Referring to FIG. 3D, the sacrificial layer 130 may be etched-back to expose the conductive layer 120*b* for the second bit line. In example embodiments, a portion of the conductive layer 120*b* for the second bit line as well as an upper surface of the conductive layer 120*b* may be partially exposed through an etched sacrificial layer 130*a*.

Figure 3E:
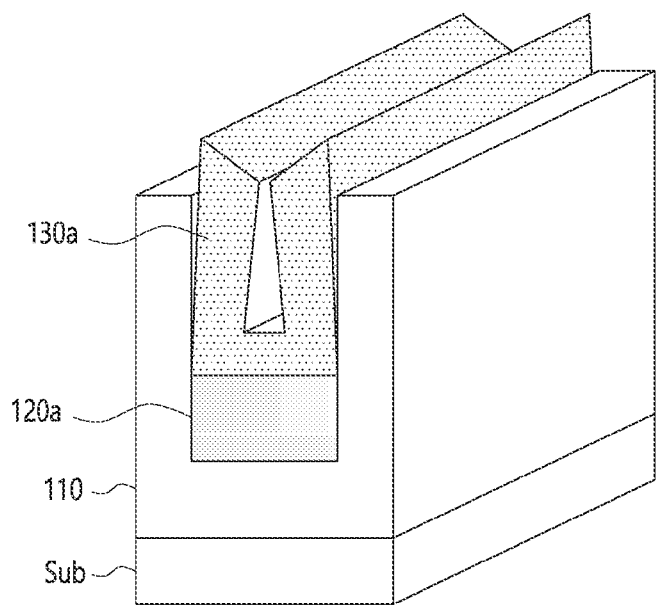

Referring to FIG. 3E, the exposed conductive layer 120*b* for the second bit line may be selectively removed. For example, the conductive layer 120*b* for the second bit line may be removed by a wet etching process. By etching the conductive layer 120*b* for the second bit line through the wet etching process, the conductive layer 120*b* for the second bit line remaining on the side surface of the trench t may be readily removed through a gap between the sacrificial layer 130*a* and the insulating interlayer 110. In contrast, because the sacrificial layer 130*a* may cover the conductive layer 120*a* for the first bit line, the conductive layer 130*a* for the first bit line may be protected in the wet etching process.

Figure 3F:
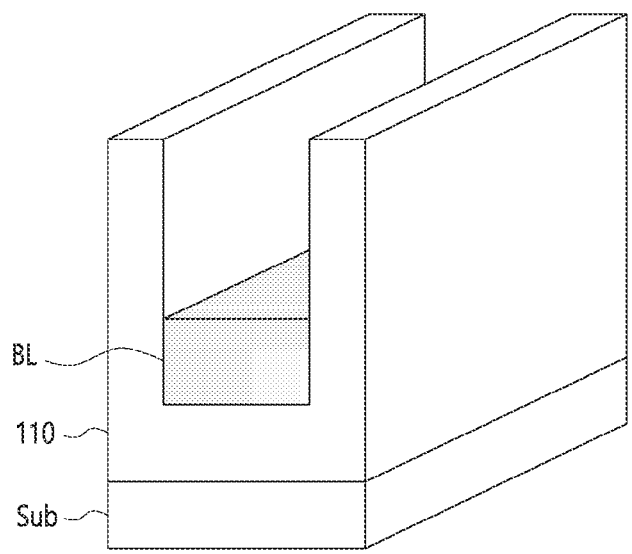

Referring to FIG. 3F, the sacrificial layer 130*a* may be selectively removed to expose the conductive layer 120*a* for the first bit line. The conductive layer 120*a* may be a bit line BL.

Although not depicted in drawings, the bit line BL may be electrically connected with the contact plugs CP in FIG. 3A.

When the conductive layer 120*b* for the second bit line may partially remain on the upper surface of the insulating interlayer 110 and the side surface of the trench t after removing the sacrificial layer 130*a*, the remaining conductive layer 120*b* for the second bit line may be removed by a cleaning process. Although the conductive layer 120*a* for the first bit line may be partially removed together with the conductive layer 120*b* for the second bit line, as indicated above, the thick thickness of the conductive layer 120 for the bit line may be set the lost portion so that a problem of an electrical characteristic might not be an issue.

Figure 3G:
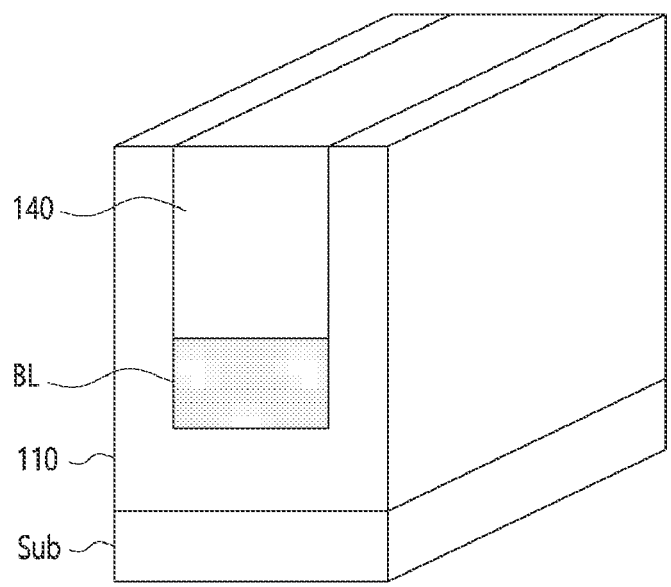

Referring to FIG. 3G, a gap-filling insulation layer 140 may be formed in the trench t. Because the aspect ratio of the trench t may be compensated by the thickness of the bit line BL, a void might not be generated in the gap-filling insulating layer 140. The gap-filling insulating layer 140 may be formed by a deposition process having step coverage better than that of the PVD process. For example, the gap-filling insulating layer 140 may be formed by a process substantially equal to or greater than the process for forming the sacrificial layer 130.

FIGS. 4A to 4G are cross-sectional views illustrating a method of forming a buried gate of a semiconductor device in accordance with example embodiments.

Figure 4A:
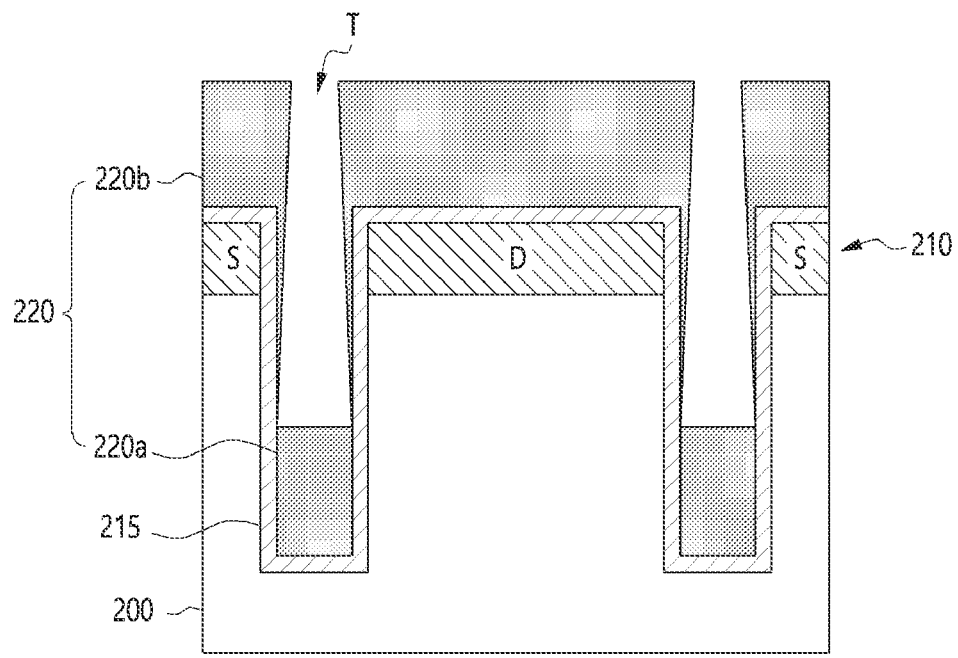
FIGS. 4A to 4G are cross-sectional views illustrating a method of forming a buried gate of a semiconductor device in accordance with example embodiments.

Referring to FIG. 4A, a semiconductor substrate 200 may be prepared.

In an example embodiment, the semiconductor substrate 200 may include silicon, single crystalline silicon, polysilicon, amorphous silicon, silicon germanium, a single crystalline silicon germanium, polycrystalline silicon germanium, silicon doped with carbon, a combination thereof, a multi-layer thereof, etc. The semiconductor substrate 200 may include a semiconductor material such as germanium. The semiconductor substrate 200 may include a silicon-on-insulator (SOI) substrate. At least one conductive impurity region 210 may be formed in an upper region of the semiconductor substrate 200.

A trench T may be formed in the semiconductor substrate 200. A depth and a width of the trench T may be set considering an electrical characteristic of a transistor to be formed in the trench T. The conductive impurity region 210 may be divided by the trench t to define a source S and a drain D. The trench T may have a linear shape from a planar view.

After forming the trench T, a gate insulation layer 215 may be conformally formed on a surface of the semiconductor substrate 200 with the trench T. The gate insulation layer 215 may include silicon oxide, silicon nitride, silicon oxynitride, a high-k material, a combination thereof, etc. For example, the gate insulation layer 215 may be formed by an ALD process.

A gate metal layer 220 may be formed on the semiconductor substrate 200 with the gate insulation layer 215. In example embodiments, the gate metal layer 220 may be formed by the first deposition process, such as the PVD process. The gate metal layer 215 may have a thickness thicker by about 1% to about 20% than a designed thickness of a gate. A reference numeral 220*a* may refer to a first gate metal layer formed on a bottom surface of the trench T. A reference numeral 220*b* may refer to a second gate metal layer formed on an upper surface of the semiconductor substrate 200 and an upper side surface of the trench T.

Figure 4B:
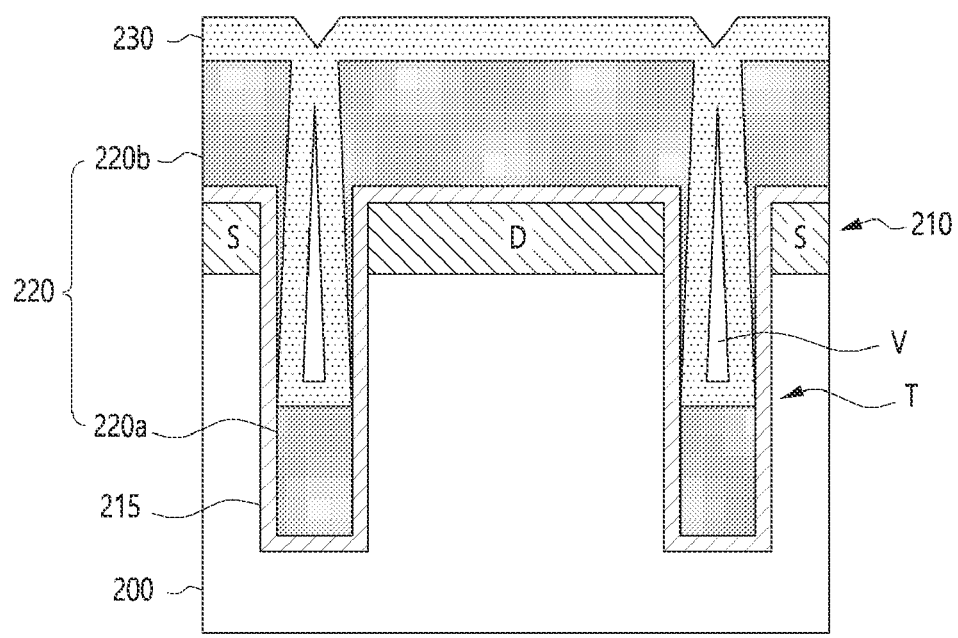

Referring to FIG. 4B, a gate sacrificial layer 230 may be formed on the gate metal layer 220. For example, the gate sacrificial layer 230 may include a material having an etching selectivity with respect to the gate insulation layer 215 and the gate metal layer 220.

The gate sacrificial layer 230 may be formed by the second deposition process such as a CVD process having the step coverage better than that of the first deposition process. Thus, the gate sacrificial layer 230 may be formed along the surface of the semiconductor substrate 200 with the first and second gate metal layers 220*a* and 220*b*.

Figure 4C:
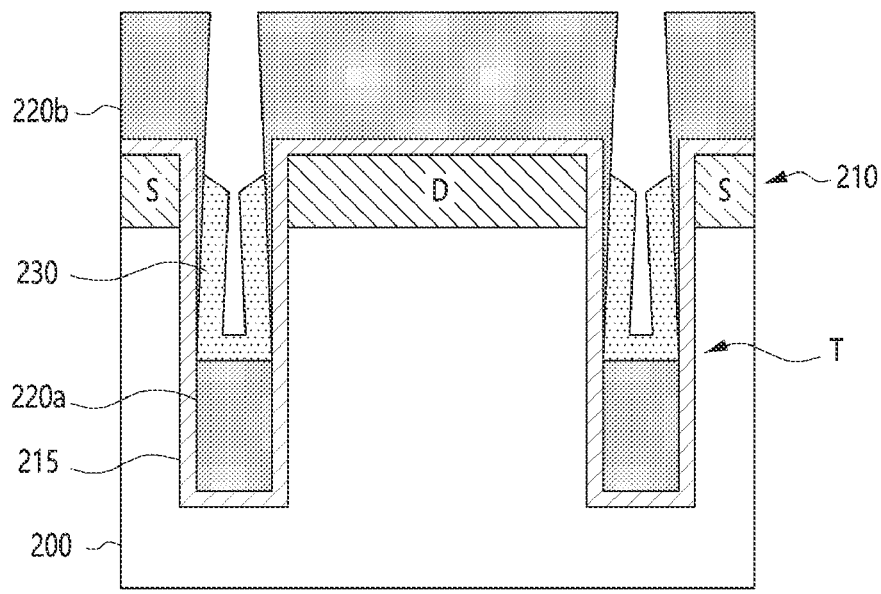

Referring to FIG. 4C, the gate sacrificial layer 230 may be etched-back to expose the second gate metal layer 220*b*. The gate sacrificial layer 230 may cover the first gate metal layer 220*a*. A reference numeral 230 may be an etched gate sacrificial layer.

Figure 4D:
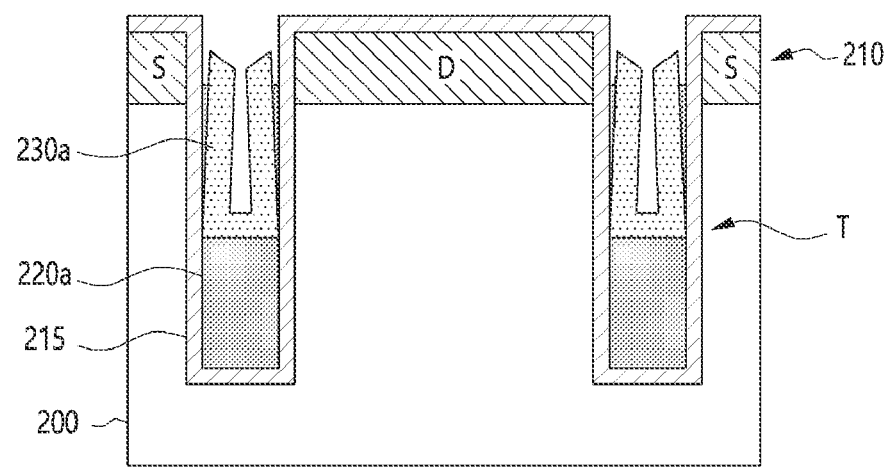

Referring to FIG. 4D, the exposed second gate metal layer 220*b* may be selectively removed using the gate sacrificial layer 230*a* as a mask. The second gate metal layer 220*b* may be removed by a wet etching process.

Figure 4E:
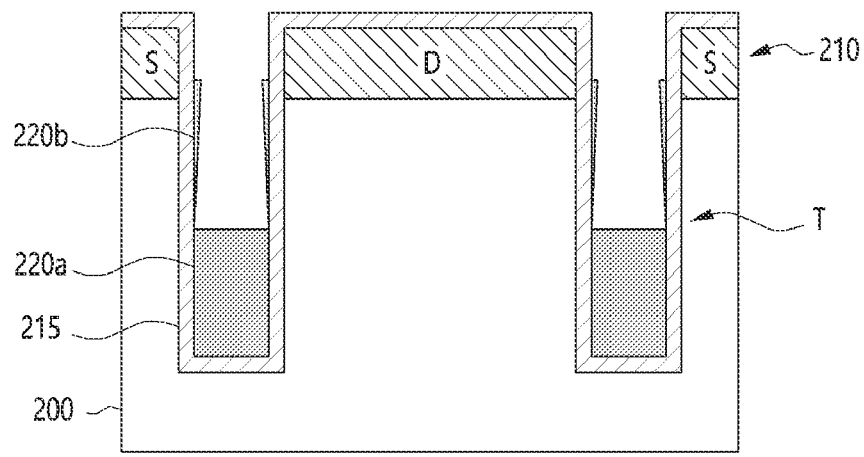
Figure 4F:
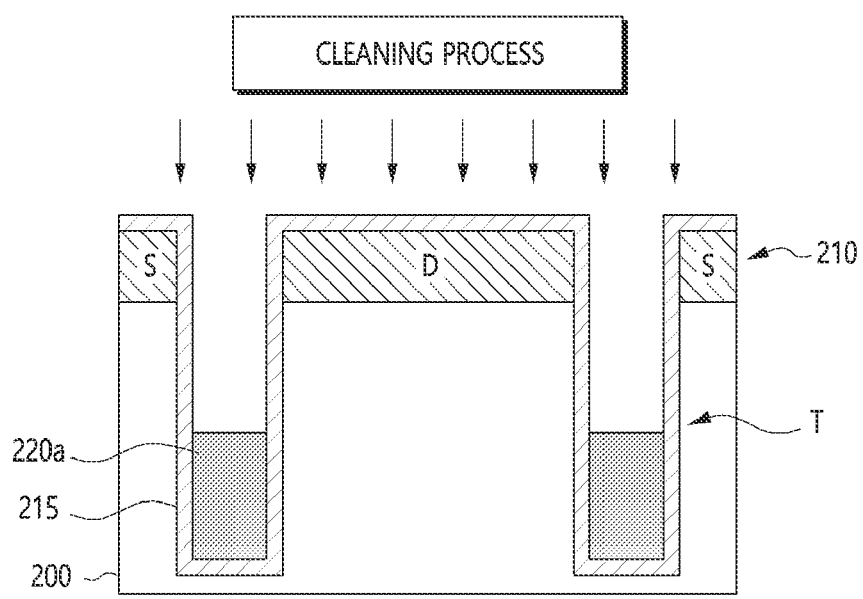

Referring to FIG. 4E, the gate sacrificial layer 230 in the trench T may be selectively removed. Because the gate sacrificial layer 230 may have the etching selectivity with respect to the gate insulation layer 215 and the gate metal layer 220, the gate insulation layer 215 and the first gate metal layer 220a may protect the gate sacrificial layer 230 from an etching agent for etching the gate sacrificial layer 230, When the second gate metal layer 220b may partially remain on the side surface of the trench T after removing the gate sacrificial layer 230, as shown in FIG. 4F, the remaining second gate metal layer 220b may be removed by a cleaning process. Thus, the first gate metal layer 220a may remain on the bottom surface of the trench T.

Figure 4G:
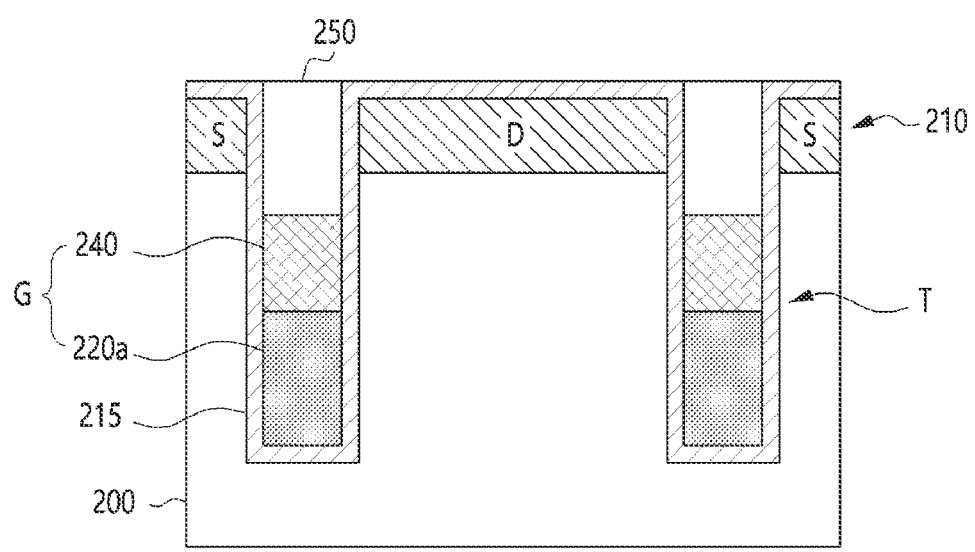

Referring to FIG. 4G, a gate conductive layer 240 may be formed in the trench T with the first gate metal layer 220a. The gate conductive layer 240 may be formed by the third deposition process having step coverage and burying characteristic better than those of the first deposition process.

The gate conductive layer 240 may include a polysilicon layer doped with impurities. The gate conductive layer 240 may be recessed to have a thickness less than bottom surfaces of the source S and the drain D. Thus, a buried gate G may include the first gate metal layer 220a and the recessed gate conductive layer 240 sequentially stacked. Further, a gap-filling insulation layer 250 may be formed on the buried gate G in the trench T.

According to example embodiments, the conductive lines may be selectively formed on the bottom surface of the trench using the PVD process having the high deposition rate with respect to the specific direction. Further, the conductive pattern may be selectively formed on the bottom surface of the contact hole using the process so that the conductive line or the conductive pattern in the trench or the contact hole having the high aspect ratio might not have the void or the seam without the electrical connection.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Additions, subtractions, and/or modifications are possible in view of the present disclosure and are intended to fall within the scope of the appended claims.

What is claimed is:

1. A method of manufacturing a semiconductor device, the method comprising:
   providing an insulating interlayer;
   forming a trench in the insulating interlayer by etching a selected portion of the insulating interlayer;
   forming a conductive layer on a bottom, a side, and an upper surface of the insulating interlayer where the trench is formed, using a first deposition process, wherein a thickness of the conductive layer formed on the bottom surface of the trench is greater than a thickness of the conductive layer formed on the side surface of the trench;
   forming a sacrificial layer in the trench to cover the conductive layer formed on the bottom surface of the trench using a second deposition process different from the first deposition process;
   selectively removing the conductive layer formed on the upper surface of the insulating interlayer and formed on the side surface of the trench left exposed through the sacrificial layer; and
   selectively removing the sacrificial layer, to form a conductive line using the conductive layer remaining on the bottom surface of the trench,
   wherein the sacrificial layer is formed by at least one of a chemical vapor deposition (CVD) process, a plasma enhanced chemical vapor deposition PECVD) process, an atomic layer deposition (ALD) process, and a plasma enhanced atomic layer deposition process (PEALD).

2. The method of claim 1, further comprising filing the trench where the conductive line is formed with a material layer.

3. The method of claim 2, wherein the material layer comprises at least one of an additional conductive layer and a gap-filling insulation layer.

4. The method of claim 1, wherein the first deposition process is a physical vapor deposition (PVD) process.

5. The method of claim 1, wherein forming the sacrificial layer comprises:
   conformally depositing the sacrificial layer along surfaces of the conductive layer formed on the insulating interlayer in and around the trench; and
   etching-back the sacrificial layer to expose the conductive layer on the upper surface of the insulating interlayer.

6. The method of claim 5, wherein the second deposition process has superior step coverage to step coverage of the first deposition process.

7. The method of claim 1, wherein the sacrificial layer comprises a material having an etching selectivity with respect to the insulating interlayer and the conductive layer.

8. The method of claim 1, further comprising removing the sacrificial layer, wherein the conductive layer remained on the side surface of the trench is removed after removing the sacrificial layer.

9. The method of claim 1, wherein the insulating interlayer includes a plurality of contact plugs,
   wherein at least one of the plurality of contact plugs is left exposed when the trench is formed.

10. A method of manufacturing a semiconductor device, the method comprising:
    providing an insulation layer including a first hole, the first hole having a first aspect ratio;
    forming a conductive layer on the insulation layer by a first deposition process, the first deposition process having a first deposition rate on a side surface of the first hole and a second deposition rate on a bottom surface of the first hole, and the second deposition rate being higher than the first deposition rate;
    forming a sacrificial layer in the first hole to cover the conductive layer on the bottom surface of the first hole;
    selectively removing the conductive layer formed on the side surface of the first hole exposed through the sacrificial layer;
    removing the sacrificial layer to define a second hole on the conductive layer in the first hole, the second hole having a second aspect ratio lower than the first aspect ratio; and
    forming a gap-filling insulation layer in the second hole,
    wherein the sacrificial layer is formed by at least one of a chemical vapor deposition (CVD) process, a plasma enhanced chemical vapor deposition (PECVD) process, an atomic layer deposition (ALD) process, and a plasma enhanced atomic layer deposition process (PEALD).

11. The method of claim 10, wherein a planar shape of the first hole has a linear shape or a pattern shape.

12. The method of claim 10, wherein forming the sacrificial layer comprises:
   forming the sacrificial layer along surfaces of the conductive layer formed on the insulation layer in and around the first hole by a second deposition process different from the first deposition process; and
   etching-back the sacrificial layer to expose the conductive layer on the upper surface of the insulation layer around the first hole.

13. The method of claim 10, further comprising removing the sacrificial layer, wherein the conductive layer remained on the side surface of the first hole is removed after removing the sacrificial layer.

14. The method of claim 10, further comprising forming an additional conductive layer on the conductive layer at the bottom of the second hole and then forming the gap-filling insulation layer in the second hole over the additional conductive layer.

15. The method of claim 14, wherein the conductive layer comprises at least one of a metal layer having at least one metal element; a metal nitride layer having at least one metal element and nitrogen element; a metal oxynitride layer having at least one metal element, nitrogen element, and oxygen element; a metal silicide having at least one metal element and silicon element; and a doped polysilicon layer including conductive impurities, and
   the additional conductive layer comprises a polysilicon layer including the conductive impurities.

16. A method of manufacturing a semiconductor device, the method comprising:
   providing a semiconductor substrate including an impurity region;
   etching the semiconductor substrate to form a trench;
   forming a gate insulation layer on a surface of the trench and an upper surface of the semiconductor substrate;
   forming a first gate conductive layer on the gate insulation layer by a first deposition process, the first deposition process having a first deposition rate on a portion substantially parallel to the upper surface of the semiconductor substrate and a second deposition rate on a portion substantially perpendicular to the upper surface of the semiconductor substrate, wherein the second deposition rate is higher than the first deposition rate;
   forming a sacrificial layer in the trench to expose the first gate conductive layer on the upper surface of the semiconductor substrate and a side surface of the trench;
   selectively removing the first conductive layer exposed through the sacrificial layer; and
   removing the sacrificial layer to form a buried gate using the first gate conductive layer remaining in the trench.

17. The method of claim 16, wherein forming the buried gate comprises forming a second gate conductive layer on the first gate conductive layer, wherein the second gate conductive layer comprises a material different from a material of the first gate conductive layer.

* * * * *